United States Patent
Watanabe et al.

(10) Patent No.: US 8,203,222 B2
(45) Date of Patent: Jun. 19, 2012

(54) SEMICONDUCTOR DEVICE AND METHOD OF MANUFACTURING THE SAME

(75) Inventors: Mitsuhisa Watanabe, Tokyo (JP); Koichi Hatakeyama, Tokyo (JP); Keiyo Kusanagi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 168 days.

(21) Appl. No.: 12/457,896

(22) Filed: Jun. 24, 2009

(65) Prior Publication Data
US 2009/0321912 A1 Dec. 31, 2009

(51) Int. Cl.
*H01L 23/29* (2006.01)

(52) U.S. Cl. ........ 257/790; 257/788; 257/791; 257/686; 257/777; 257/E23.121; 257/E25.006

(58) Field of Classification Search .......... 257/787–795, 257/686, 777, E23.121, E25.006
See application file for complete search history.

(56) References Cited

U.S. PATENT DOCUMENTS

| | | | |
|---|---|---|---|
| 6,011,303 A * | 1/2000 | Tanaka et al. | 257/692 |
| 7,372,137 B2 | 5/2008 | Saeki | |
| 7,474,175 B2 * | 1/2009 | Furihata et al. | 333/193 |
| 7,906,860 B2 * | 3/2011 | Meyer et al. | 257/790 |
| 2006/0214277 A1 | 9/2006 | Saeki | |
| 2007/0045791 A1 | 3/2007 | Saeki | |
| 2011/0024922 A1 * | 2/2011 | Taya et al. | 257/787 |

FOREIGN PATENT DOCUMENTS

| | | |
|---|---|---|
| JP | 2006-269861 | 10/2006 |
| JP | 2006-286829 | 10/2006 |
| JP | 2007-66932 | 3/2007 |

* cited by examiner

*Primary Examiner* — Jasmine Clark
(74) *Attorney, Agent, or Firm* — McGinn IP Law Group, PLLC

(57) ABSTRACT

A semiconductor device includes a substrate, a semiconductor chip, and first and second insulations. The substrate has at least a first region and a second region. The semiconductor chip structure covers the first region. The first insulation covers the second region. The first insulation has a first thermal expansion coefficient approximately equal to that of the semiconductor chip structure. The second insulation covers the semiconductor chip structure and the first insulation so that the semiconductor chip structure and the first insulation are sandwiched between the substrate and the second insulation. The second insulation has a second thermal expansion coefficient approximately equal to that of the substrate.

23 Claims, 9 Drawing Sheets

SEMICONDUCTOR DEVICE AND METHOD OF MANUFACTURING THE SAME

BACKGROUND OF THE INVENTION

1. Field of the Invention

The present invention relates to a semiconductor device including a semiconductor chip mounted on a wiring substrate and a method of manufacturing the same.

Priority is claimed on Japanese Patent Application No. 2008-166390, filed Jun. 25, 2008, the content of which is incorporated herein by reference.

2. Description of the Related Art

Conventionally, a BGA (Ball Grid Array)-type semiconductor device includes: a wiring substrate, on a top surface of which multiple connection pads are provided, and a bottom surface of which multiple lands are provided to be electrically connected to the connection pads; a semiconductor chip provided on the top surface of the wiring substrate; wires electrically connecting electrode pads provided on the semiconductor chip and the connection pads provided on the wiring substrate; a seal which is made of insulating resin and covers at least the semiconductor chip and the wires; and external terminals provided on the lands.

However, there has been a problem of warpage of a semiconductor device due to the difference in values of thermal expansion coefficients between a wiring substrate and a seal resin. Consequently, solder balls are not correctly connected upon a secondary mounting of the semiconductor device onto a motherboard.

Additionally, a BGA-type semiconductor device to be used for a PoP (Package on Package) cannot be electrically connected to another semiconductor device to be stacked when the semiconductor device and the other semiconductor device warp in the opposite directions.

Further, the difference in values of thermal expansion coefficients between the wiring substrate and the semiconductor chip causes stress to be applied onto a periphery of the semiconductor chip, and especially onto four corners thereof. Thereby, solder balls provided under the four corners crack, degrading the reliability of secondary mounting of the semiconductor device.

Such a semiconductor device is manufactured using MAP (Mold Array Process) and includes multiple wiring substrates and a seal collectively covering the substrates, causing the problem of warpage.

For example, Japanese Patent, Laid-Open Publication Nos. 2006-269861, 2007-66932, and 2006-286829 are related art for preventing warpage of a semiconductor device.

Japanese Patent, Laid-Open Publication Nos. 2006-269861 and 2007-66932 disclose a semiconductor device including a lower substrate (wiring substrate), semiconductor chips provided above the lower substrate, a seal covering the semiconductor chips, and an upper board provided over the seal and the semiconductor chips. A thermal expansion coefficient of the upper board is substantially the same as that of the lower substrate.

Japanese Patent, Laid-Open Publication No. 2006-286829 discloses a semiconductor device including a first resin that covers a semiconductor chip mounted on a wiring substrate and prevents deformation of bonding wires or corrosion of connections between the semiconductor chip and the bonding wires, and a second resin (seal) that is provided over the wiring substrate and the first resin to prevent warpage of the wiring substrate.

In any of the related art, the upper board or the resin layer having substantially the same thermal expansion coefficient as that of the wiring substrate is provided over the seal covering the semiconductor chip mounted on the wiring substrate, thereby preventing warpage of the semiconductor device caused by the difference in values of thermal expansion coefficients between the wiring substrate and the seal.

However, any of the related art are silent about warpage of the semiconductor device and stress applied to the four corner of the semiconductor device which are caused by the difference in values of thermal expansion coefficients between the wiring substrate and the semiconductor chip. Therefore, solder balls provided around a periphery of the semiconductor chip, especially around the four corners thereof crack.

Additionally, the upper board or the resin layer for preventing warpage is provided over the seal covering the semiconductor chip, resulting in variation in thickness of the seal. Thereby, the semiconductor chip might be warped due to the variation.

Warpage of one semiconductor device causes a more significant problem of warpage of multiple stacked semiconductor devices having the PoP structure. Additionally, the problem is more significant as the size of the wiring substrate increases.

SUMMARY

In one embodiment, there is provided a semiconductor device including: a substrate; a semiconductor chip; a first insulation; and a second insulation. The substrate has at least a first region and a second region. The semiconductor chip structure covers the first region. The first insulation covers the second region. The first insulation has a first thermal expansion coefficient approximately equal to that of the semiconductor chip structure. The second insulation covers the semiconductor chip structure and the first insulation so that the semiconductor chip structure and the first insulation are sandwiched between the substrate and the second insulation. The second insulation has a second thermal expansion coefficient approximately equal to that of the substrate.

In another embodiment, there is provided a method of manufacturing a semiconductor device including the following processes. A first insulation covering a second region of a substrate having at least a first region covered by a semiconductor chip structure and the second region is formed. The first insulation has a thermal expansion coefficient approximately equal to that of the semiconductor chip structure. A second insulation covering the first insulation and the semiconductor chip structure is formed so that the first insulation and the semiconductor chip structure are sandwiched between the substrate and the second insulation. The second insulation has a thermal expansion coefficient approximately equal to that of the substrate.

Accordingly, warpage of the semiconductor device due to the difference in values of thermal expansion coefficients between the semiconductor chip structure and the substrate and between the substrate and a seal including the first and second insulations can be prevented.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will now be described herein with reference to illustrative embodiments. The accompanying drawings explain a semiconductor device and a method of manufacturing the semiconductor device in the embodiments, and the size, the thickness, and the like of each illustrated portion might be different from those of each portion of an actual semiconductor device.

Figure 1:
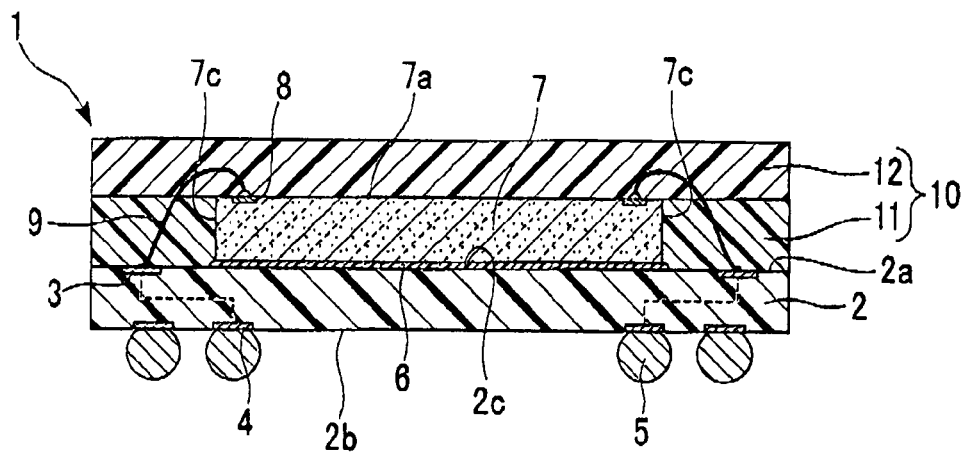
FIG. 1 is a cross-sectional view illustrating a semiconductor device according to a first embodiment of the present invention.
Figure 2:
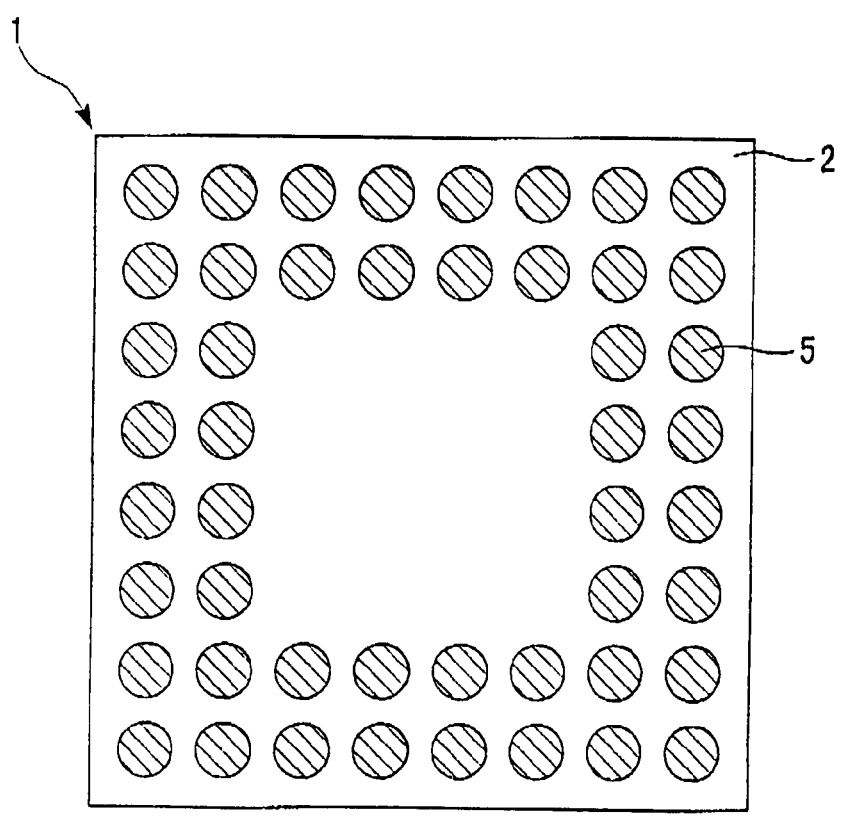
FIG. 2 is a plane view illustrating a surface of the semiconductor device according to the first embodiment where external terminals are provided.

Those skilled in the art will recognize that many alternative embodiments can be accomplished using the teachings of the present invention and that the invention is not limited to the embodiments illustrated herein for explanatory purposes.
First Embodiment:

FIG. 1 is a cross-sectional view illustrating a semiconductor device 1 according to a first embodiment of the present invention. FIG. 2 is a plane view illustrating a bottom surface of the semiconductor device 1.

As shown in FIG. 1, the semiconductor device 1 schematically includes a wiring substrate 2, a semiconductor chip 7, wires 9, and seals 10.

As shown in FIG. 2, the wiring substrate 2 is substantially rectangular when planarly viewed and made of, for example, glass epoxy resin having a thickness of approximately 0.25 mm. Given wirings are provided on the wiring substrate 2 and partially covered by an insulating film (not shown). The insulating film is, for example, a solder resist film and is deposited on both surfaces of the glass epoxy substrate.

Multiple connection pads 3 are provided for wirings on a surface 2a of the wiring substrate 2 not covered by the insulating film. Multiple lands 4 are provided for wirings on a surface 2b of the wiring substrate 2 not covered by the insulating film. The connection pads 3 and the corresponding lands 4 are electrically connected through the wirings in the wiring substrate 2.

Multiple solder balls 5, which will be external terminals, are mounted on the respective lands 4 in a grid at a given interval as shown in FIG. 2.

A semiconductor chip 7 is fixed on substantially the center of the surface 2a of the wiring substrate 2 through a fixing member 6, such as an insulating adhesive or DAF (Die Attached Film). For example, a logic circuit or a memory circuit is formed on the surface 7a of the semiconductor chip 7.

Multiple electrode pads 8 are provided on the surface 7a of the semiconductor chip 7. A passivation film (not shown) is provided on the surface 7a of the semiconductor chip 7 to cover the circuit formation surface excluding the electrode pads 8.

The electrode pads 8 are electrically connected to the respective connection pads 3 through conductive wires 9 made of, for example, Au or Cu.

A seal 10 is formed over the surface 2a of the wiring substrate 2 to cover the semiconductor chip 7 and the wires 9. The seal 10 is made of thermosetting resin, such as epoxy resin, and includes two types of resins having different thermal expansion coefficients.

The resins having different thermal expansion coefficients can be obtained by, for example, the content of a filler being changed. Specifically, the thermal expansion coefficient decreases as the content of the filler increases. On the other hand, the thermal expansion coefficient increases as the content of the filler decreases. The filler includes, for example, a glass fiber.

The seal 10 includes a first resin (first insulating layer) 11 having a low thermal expansion coefficient and a second resin (second insulating layer) 12 having a high thermal expansion coefficient.

The first resin 11 is deposited over the surface 2a of the wiring substrate 2 excluding a region 2c on which the semiconductor chip 7 is mounted, and in contact with the side surfaces 7c of the semiconductor chip 7. The second resin 12 is deposited over the semiconductor chip 7 and the first resin 11.

Thus, the seal including the first resin 11 having the low thermal expansion coefficient is formed on the side surfaces 7c of the semiconductor chip 7 and on the surface 2a of the wiring substrate 2 excluding the region 2c on which the semiconductor chip 7 is mounted. The thermal expansion coefficient of the first resin is in a given range which includes the terminal expansion coefficient of the semiconductor chip. The given range is determined so that the semiconductor device does not warp due to the difference in the values of the thermal expansion coefficients.

Specifically, the thermal expansion coefficient of the first resin is set to approximately $2\times10^{-4}$ to $4\times10^{-6}/°$ C., preferably to $3\times10^{-6}/°$ C. $3\times10^{-6}/°$ C. is an approximate value of the thermal expansion coefficient of silicon forming the semiconductor chip.

The second resin 12 having a high thermal expansion coefficient is formed on the surface 7a of the semiconductor chip 7a and the first resin 11. The thermal expansion coefficient of the second resin is in a given range which includes the terminal expansion coefficient of the semiconductor chip. The given range is determined so that the semiconductor device does not warp due to the difference in the values of thermal expansion coefficients.

Specifically, the thermal expansion coefficient of the second resin 12 is set to approximately $12\times10^{-6}$ to $14\times10^{-6}/°$ C., preferably to $13 \times 10^{-6}/°$ C. $13 \times 10^{-6}/°$ C. is an approximate value of the thermal expansion coefficient of glass epoxy resin.

The second resin 12 may have a different thickness from that of the wiring substrate 2 as long as the thermal expansion of the second resin 12 is balanced with that of the wiring substrate 2.

Thus, the first resin 11 made of a material having a low thermal expansion coefficient approximately equal to that of the semiconductor chip 7 is provided on the side surfaces 7c of the semiconductor chip 7 and the surface 2a of the wiring substrate 2. Additionally, the second resin 12 made of a material having a high thermal expansion coefficient approximately equal to that of the wiring substrate 2 is provided over the surface 7a of the semiconductor chip 7. Thereby, a balance of thermal expansion coefficients is improved, and warpage of the semiconductor device 1 can be prevented.

In other words, the semiconductor chip 7 and the first resin 11 are sandwiched between the wiring substrate 2 and the second resin 12. Additionally, the semiconductor chip 7 has substantially the same thermal expansion coefficient as that of the first resin 11. Thereby, the semiconductor chip 7 and the first resin 11 thermally expand or contract in an integrated manner.

Consequently, the semiconductor chip 7 and the first resin 11 cause substantially the same degree of distortion to both the wiring substrate 2 and the second resin 12, thereby preventing warpage of the entire semiconductor device 1.

Since the first and second resins 11 and 12 are made of epoxy resin, adhesion of the first and second resins 11 and 12 increases, thereby preventing the first and second resins 11 and 12 from removing from each other.

Since the second resin 12 having a high thermal expansion coefficient approximately equal to that of the wiring substrate 2 is provided over the surface 7a of the semiconductor chip 7, a balance of upward and downward thermal expansion of the semiconductor chip 7 and the first resin 11 can be enhanced. Thereby, warpage caused by the difference in the values of the thermal expansion coefficients between the semiconductor chip 7 and the wiring substrate 2 and between the seal 10 and the wiring substrate 2 can be reduced.

Further, the thickness of the first resin 11 becomes uniform, as is the thickness of the second resin 12. Thereby, thermal expansion of the seal 10 is enhanced, and warpage caused by the difference in values of the thicknesses of resins can be reduced.

As a result of a reduction in warpage of the semiconductor device 1, precision of the overall size of the semiconductor device 1 is enhanced, thereby enhancing the mounting precision. Additionally, a load is applied equally to each external terminal, and therefore connection strength is equalized, thereby enhancing the reliability of the mounting of the semiconductor device 1.

Figure 3A:
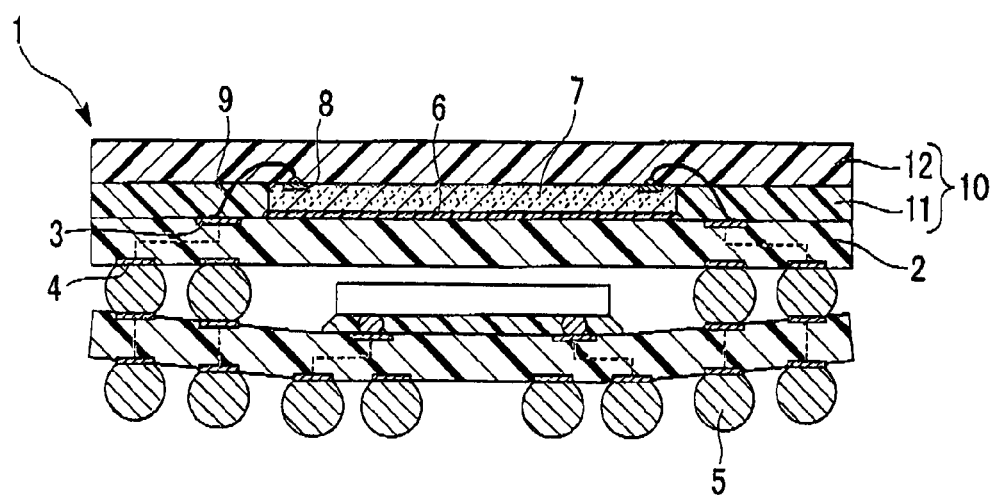
FIGS. 3A and 3B are cross-sectional views illustrating a state of the semiconductor device according to the first embodiment being stacked on a warped semiconductor device.
Figure 3B:
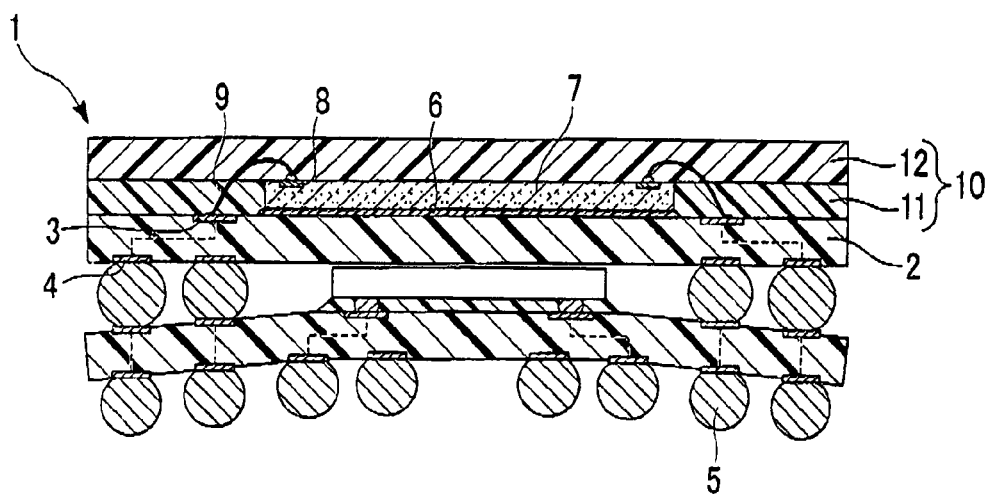

When the semiconductor device 1 is used as PoP, the semiconductor device 1 can be stably connected to another semiconductor device regardless of the warpage of the other semiconductor device, as shown in FIG. 3. Further, warpage of the semiconductor device 1 is reduced, and therefore the number of semiconductor devices to be stacked can be increased, resulting in high density mounting.

Hereinafter, a method of manufacturing the semiconductor device 1 according to the first embodiment is explained.

FIGS. 4A to 4E are cross-sectional views indicative of a schematic process flow illustrating a method of manufacturing the semiconductor device according to the first embodiment.

A wiring motherboard 13 to be used in the first embodiment is subjected to MAP (Mold Array Process), and multiple element formation units 14 are arranged in a matrix. The wiring motherboard 13 will be diced into multiple pieces of the element formation units 14. Then, each of the element formation units 14 will become the aforementioned wiring substrate 2 and have the same configuration as that of the wiring substrate 2.

A frame 15 is provided surrounding the element formation units 14. Holes (not shown) are provided at a given interval in the frame 15 for transportation and positioning. Boundaries among the element formation units 14 are dicing lines 16.

Figure 4A:
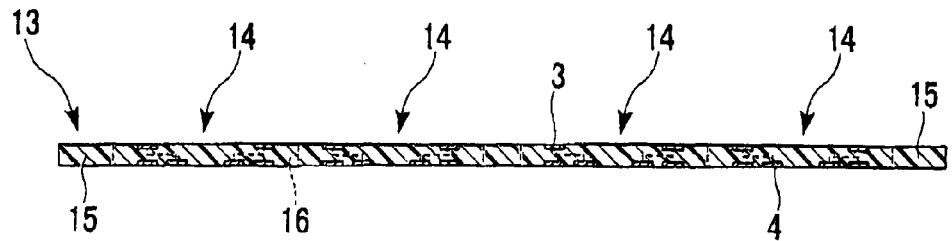
FIGS. 4A to 4E are cross-sectional views indicative of a schematic process flow illustrating a method of manufacturing the semiconductor device according to the first embodiment.

Thus, the wiring motherboard 13 as shown in FIG. 4A is prepared.

Figure 4B:
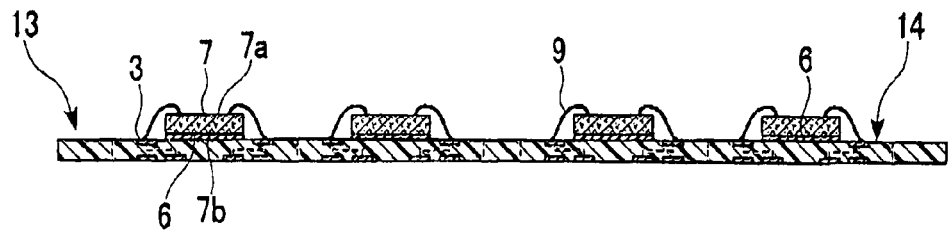

Then, a bottom surface 7b of the semiconductor chip 7 is fixed on substantially the center of a surface of each element formation unit 14 through an insulating adhesive or DAF, as shown in FIG. 4B.

Then, the electrode pads 8 provided on the surface 7a of the semiconductor chip 7 and the connection pads 3 provided on the element formation unit 14 are connected through conductive wires 9 made of, for example, Au. Specifically, one end of the wire 9 is melted into a ball shape by a wire-bonding apparatus (not shown), and then connected by ultrasonic thermocompression to the electrode pad 8 on the semiconductor chip 7. Then, the wire 9 is made into a given loop shape, and the other end of the wire 9 is connected by ultrasonic thermocompression to the corresponding connection pad 3.

Then, a sealing frame 17 is provided on the frame 15 on the wiring motherboard 13. The frame 17 has a similar shape to that of the frame 15, and has the same thickness as that of the semiconductor chip 7. The frame 17 may have a thickness greater than that of the semiconductor chip 7 if an amount of potting is controlled.

Figure 5A:
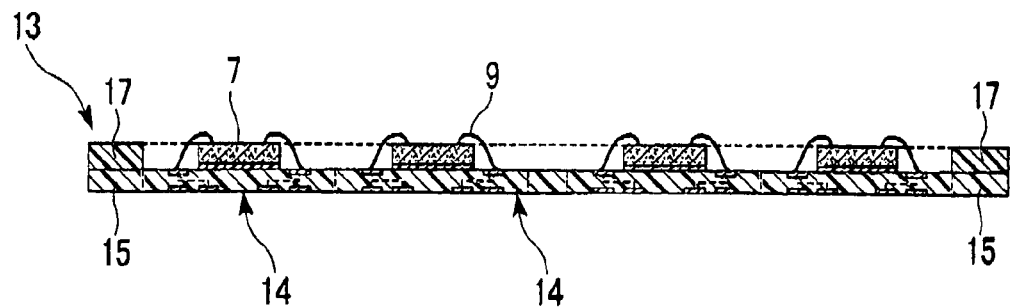
FIGS. 5A to 5D are cross-sectional views illustrating a process of manufacturing a first resin seal included in the method of manufacturing the semiconductor device according to the first embodiment.
Figure 5B:
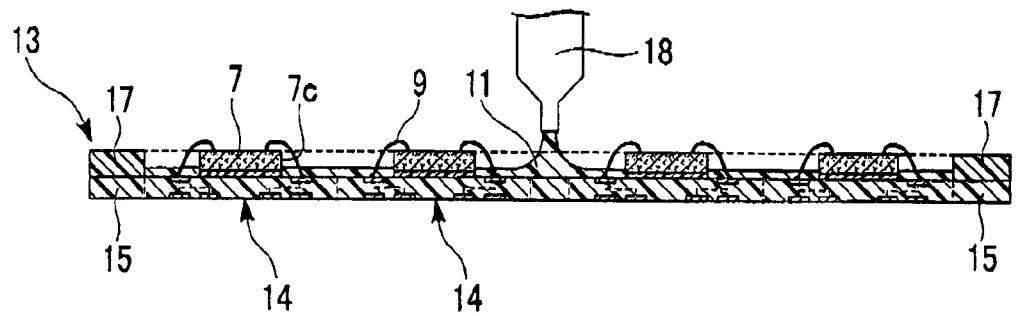

The first resin 11 is provided around the semiconductor chip 7 using a potting apparatus 18, such as a coating applicator, as shown in FIG. 5B. The first resin 11 is, for example, an epoxy resin having a low thermal expansion coefficient approximately equal to $2 \times 10^{-6}$ to $4 \times 10^{-6}/°$ C. Preferably, resin having a thermal expansion coefficient approximately equal to $3 \times 10^{-6}/°$ C. which is a value of the thermal expansion coefficient of silicon forming the semiconductor chip is used. The frame 17 is used for blocking the sealing resin.

Figure 5C:
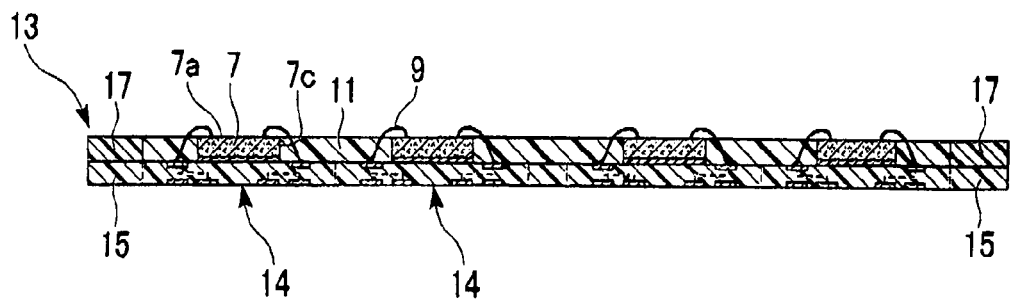
Figure 5D:
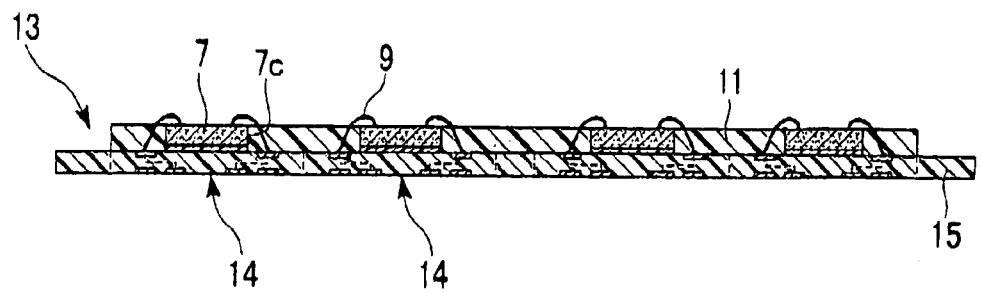

The first resin 11 is filled until the side surfaces 7c of the semiconductor chip 7 mounted on the wiring motherboard 13 are completely immersed into the first resin 11, as shown in FIG. 5C. Preferably, the first resin 11 has the same height as that of the upper surface 7a of the semiconductor chip 7, but may have a height approximately equal to that of the upper surface 7a of the semiconductor chip 7.

After the first resin 11 is filled up to the upper surface 7a of the semiconductor chip 7, the first resin 11 is cured at, for example, 180° C. Then, the frame 17 is removed from the wiring motherboard 13, and the wiring motherboard 13 with the first resin 11 formed around the semiconductor chips 7 is obtained.

Figure 6A:
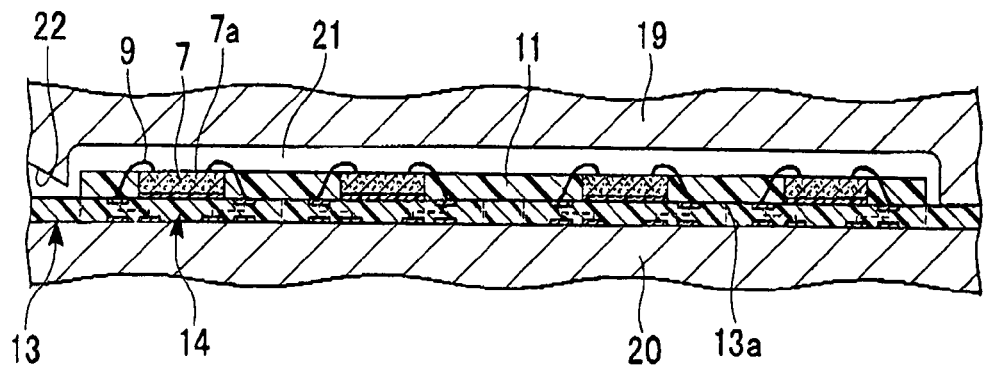
FIGS. 6A to 6C are cross-sectional views illustrating a process of manufacturing a second resin seal included in the method of manufacturing the semiconductor device according to the first embodiment.

Then, the wiring motherboard 13 is attached to a transfer mold apparatus including an upper mold 19 and a lower mold 20, as shown in FIG. 6A. The wiring motherboard 13 is compressed by the upper and lower molds 19, 20, and thereby a cavity 21 having a given size and a gate 22 are formed on the side of a surface 13a of the wiring motherboard 13. Since MAP is used in the first embodiment, the cavity 21 has a size so as to collectively cover the element formation units 14.

Figure 6B:
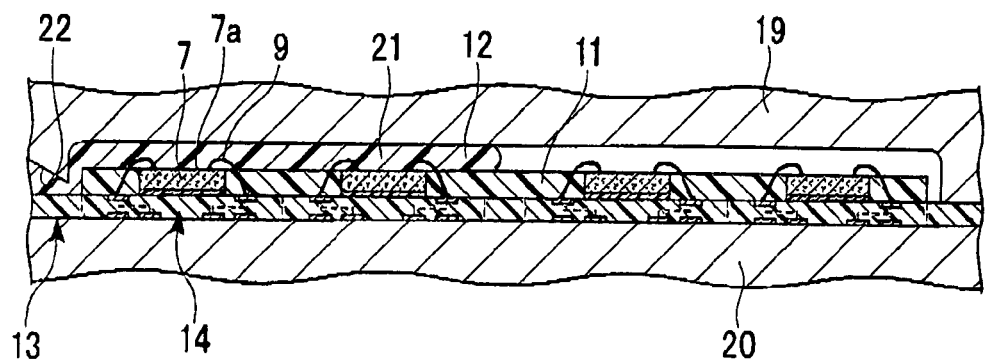

Then, the second resin 12 is provided through the gate 22 into the cavity 21 formed by the upper and lower molds 19, 20 as shown in FIG. 6B. The second resin 12 is, for example, a thermosetting epoxy resin having a thermal expansion coefficient approximately equal to $12\times10^6$ to $14\times10^{-6}/°$ C., preferably equal to $13\times10^{-6}/°$ C. $13\times10^{-6}/°$ C. is a value of the thermal expansion coefficient of the wiring substrate 2 (glass epoxy resin in this case).

Figure 4C:
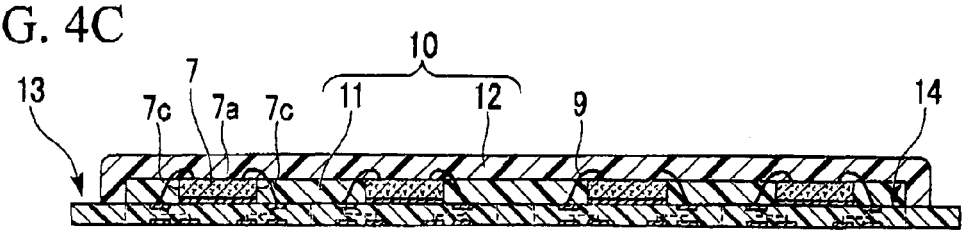
Figure 6C:
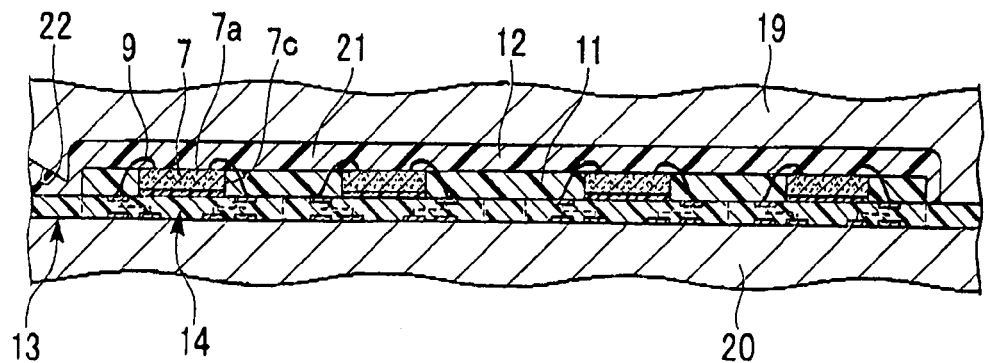

After the cavity 21 is filled with the second resin 12 as shown in FIG. 6C, the second resin 12 is cured at a given temperature, such as approximately 180° C. Thereby, the second resin 12 is formed over the first resin 11 and the upper surface 7a of the semiconductor chip 7 as shown in FIG. 4C.

Thus, the seal 10 collectively covering the wiring motherboard 13 is formed using the first resin 11 having a thermal expansion coefficient approximately equal to that of the semiconductor chip 7 and the second resin 12 having a thermal expansion coefficient approximately equal to that of the glass epoxy substrate, thereby preventing warpage of the wiring motherboard 13.

Consequently, transportation troubles due to warpage of the wiring motherboard 13 can be reduced, thereby enhancing the manufacturing efficiency. Since the surrounding regions of the semiconductor chip 7 mounted on the wiring motherboard 13 are sealed by the first resin 11, the wires 9 are fixed by the first resin 11, thereby preventing the wires from flowing when the second resin 12 is provided.

Figure 4D:
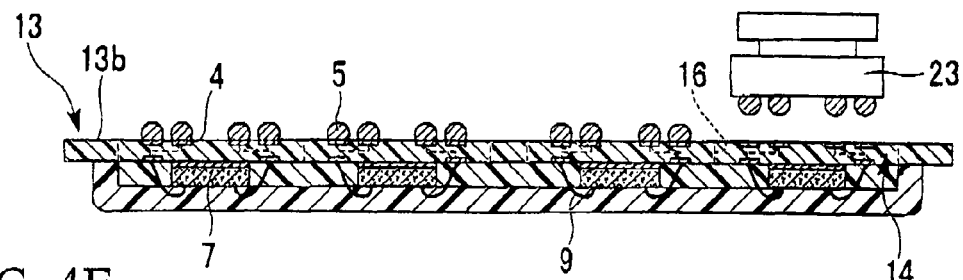

Then, the conductive solder balls 5 are mounted on the respective lands 4 arranged in a matrix on the other surface 13b of the wiring motherboard 13, and thereby external terminals are formed, as shown in FIG. 4D. Specifically, the solder balls 5 are held by multiple suction holes included in a sucking apparatus 23. Then, flux is applied to the held solder balls 5, and then the solder balls 5 are collectively mounted on the respective lands 4 provided on the other surface 13b of the wiring motherboard 13. After the solder balls 5 are mounted on all the element formation units 14, the wiring motherboard 13 is reflowed to form bump electrodes which will be external terminals.

Warpage of the wiring motherboard 13 is reduced for the aforementioned reasons, and the solder balls 5 can be correctively mounted onto the wiring motherboard 13.

Figure 4E:
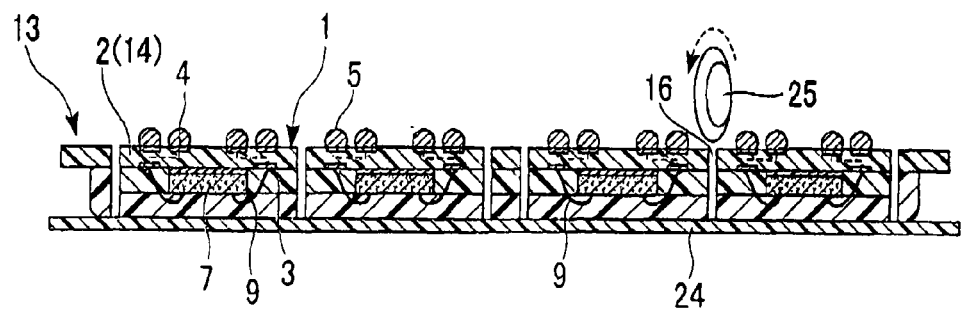

Then, the wiring motherboard 13 is diced along the dicing lines 16 into pieces of element formation units 14, as shown in FIG. 4E. In this case, the second resin 12 is fixed onto the dicing tape 24 to support the wiring motherboard 13.

Then, the wiring motherboard 13 is vertically and horizontally diced by a dicing blade 25 along the dicing lines 16 into pieces of element formation units 14. After the dicing, each piece is picked up from the dicing tape 24, thus the semiconductor device 1 as shown in FIG. 1 is obtained.

As explained above, the semiconductor device 1 including the first resin 11 which is provided on the surface 2a of the wiring substrate 2 and made of a material having a low thermal expansion coefficient approximately equal to that of the semiconductor chip 7, and the second resin 12 which is provided over the upper surface 7a of the semiconductor chip 7 and the first resin 11 and made of a material having a high thermal expansion coefficient approximately equal to that of the wiring substrate 2 can be efficiently manufactured.

Figure 7A:
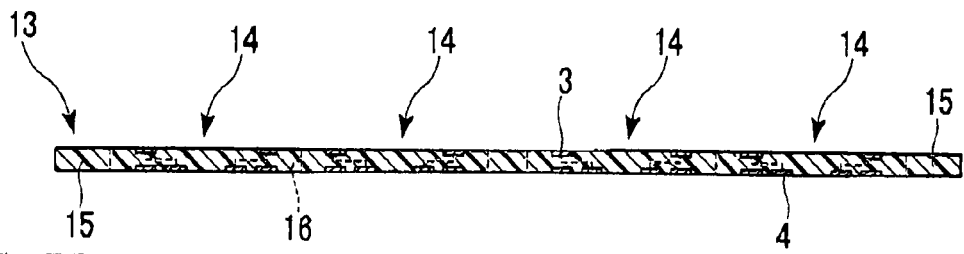
FIGS. 7A to 7E are cross-sectional views indicative of a schematic process flow illustrating a method of manufacturing the semiconductor device according to a second embodiment.
Figure 7B:
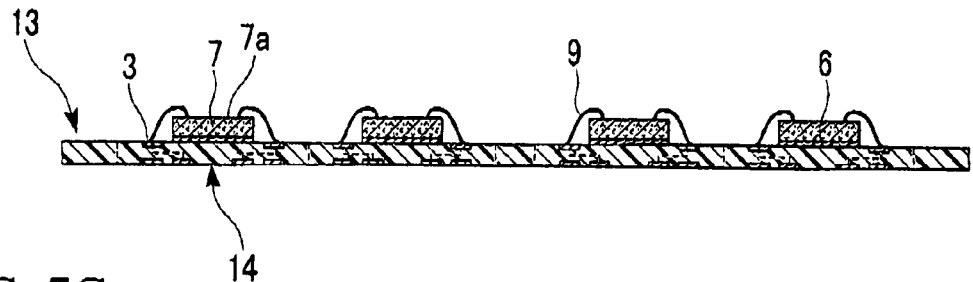
Figure 7C:
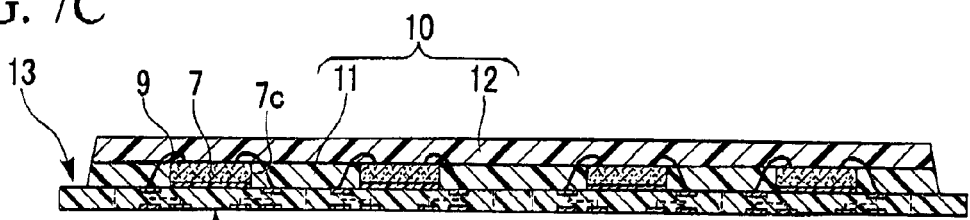

Second Embodiment:

FIGS. 7A to 7E are cross-sectional views indicative of a schematic process flow illustrating a method of manufacturing the semiconductor device according to a second embodiment. As shown in FIG. 7B, processes from the process of preparing the wiring motherboard 13 to the process of connecting the electrode pads 8 on the upper surface 7a of the semiconductor chip 7 and the connection pads 3 on the element formation unit 14 through the conductive wires 9 are the same as the first embodiment.

Figure 8A:
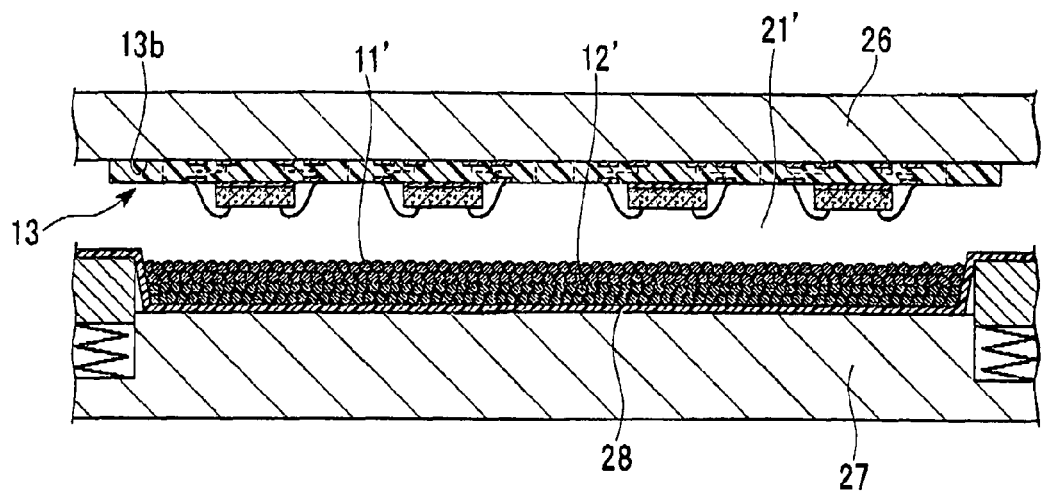
FIGS. 8A to 8C are cross-sectional views illustrating a sealing process included in the method of manufacturing the semiconductor device according to the second embodiment.
Figure 8B:
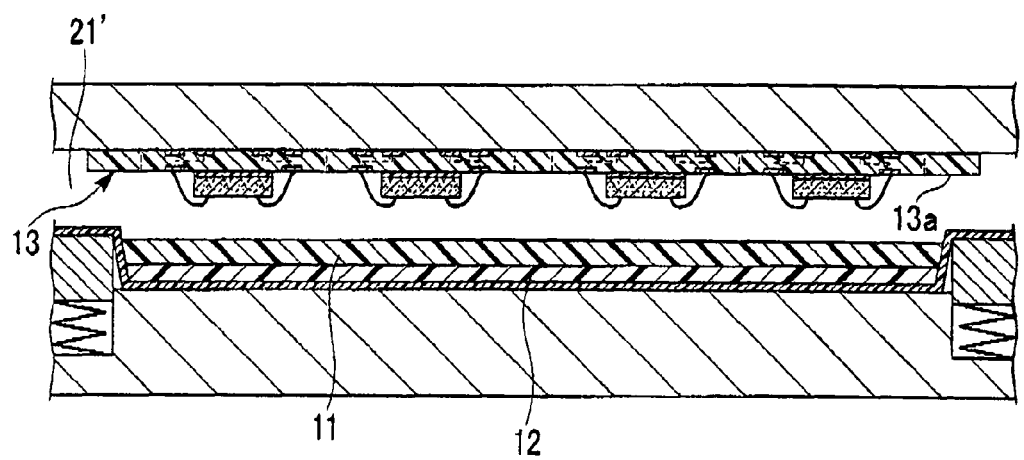

Then, in the second embodiment, the other surface 13b of the wiring motherboard 13 is fixed by suction onto an upper mold 26 included in a compression mold apparatus 26 as shown in FIG. 8A. A lower mold 27 included in the compression mold apparatus has a cavity 21', into which a given amount of second granular resin 12' is provided through a film 28.

The second resin 12' has a thermal expansion coefficient approximately equal to $12\times10^{-6}$ to $14\times10^{-6}/°$ C., and preferably equal to $13\times10^{-6}/°$ C. $13\times10^{-6}/°$ C. is a value of the thermal expansion coefficient of the wiring substrate 2 (glass epoxy resin in this case).

Further, a given amount of the first granular resin 11' is provided over the second granular resin 12' in the cavity 21'. Similar to the first embodiment, a resin having a thermal expansion coefficient approximately equal to $2\times10^{-6}$ to $4\times10^{-6}/°$ C., preferably equal to $3\times10^{-6}/°$ C. is used as the first resin 11'. $3\times10^{-6}/°$ C. is a value of the thermal expansion coefficient of silicon forming the semiconductor chip 7.

Then, the lower mold 27 is heated to a given temperature so that the first and second granular resin 11', 12' are melted to form two melted resin layers in the cavity 21'.

Figure 8C:
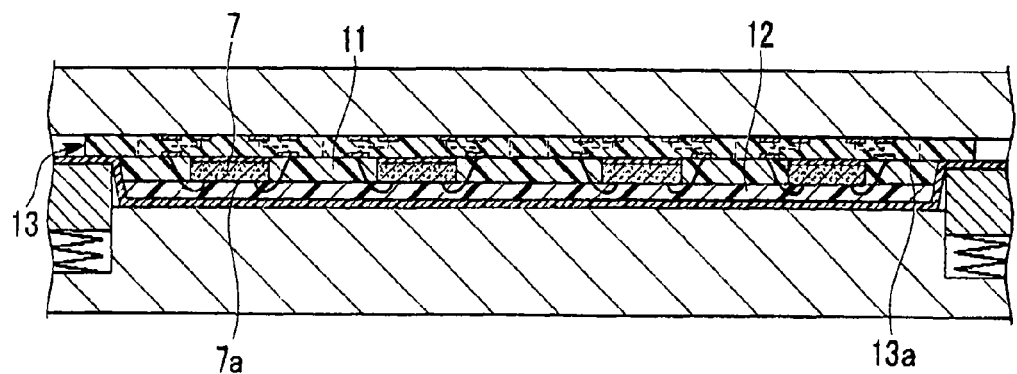

Then, the upper mold 26 is lowered so that the semiconductor chip 7 is immersed into the two melted resin layers. Then, the two melted resin layers are compressed by the upper and lower molds 26, 27 as shown in FIG. 8C, thus the first and second resin 11, 12 are formed on the wiring motherboard 13.

A height of the first resin 11 is adjusted such that the upper surface 7a of the semiconductor chip 7 provided on the wiring motherboard 13 generally matches the boundary between the first and second resin layers.

Thus, two different resin layers can simultaneously and efficiently be formed on the wiring motherboard 13.

Figure 7D:
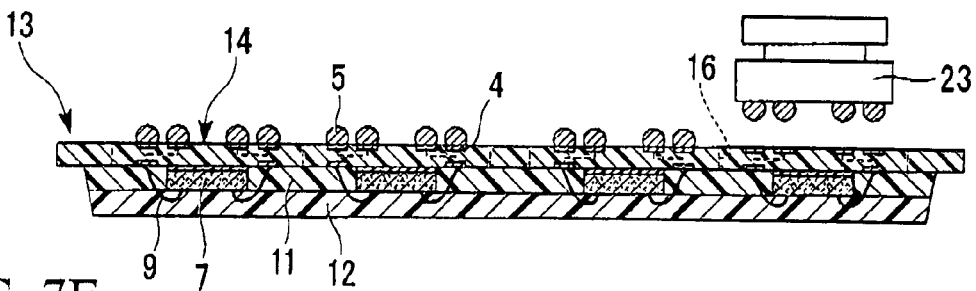

Then, the conductive solder balls 5 are mounted on the respective lands 4 to form bump electrodes which will be external terminals as shown in FIG. 7D, similarly to the first embodiment.

Figure 7E:
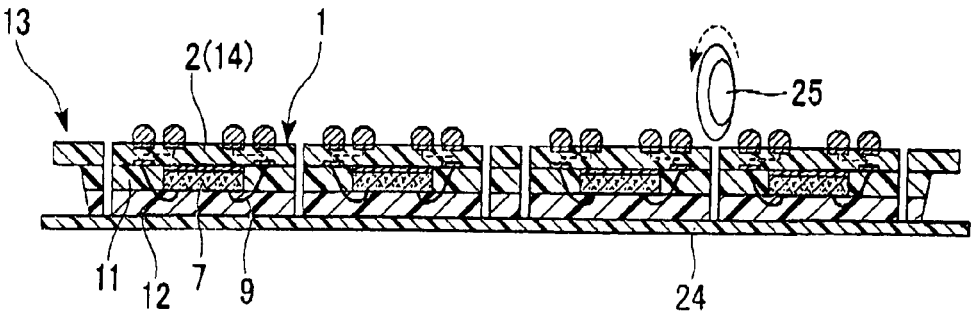

Then, the wiring motherboard 13 on which the solder balls 5 are mounted is diced along the dicing line 16 into pieces of the element formation units 14 as shown in FIG. 7E, and the semiconductor device 1 as shown in FIG. 1 is obtained.

Thus, the semiconductor device 1 whose warpage is reduced can be formed similarly to the first embodiment.

Additionally, the semiconductor chip 7 is immersed into the two melted resin layers having different thermal expansion coefficients, and then the resin layers are compressed to form the first and second resin 11, 12 on the wiring motherboard 13. Thereby, the seal 10 can efficiently be formed by one sealing process.

Further, the first and second resin 11, 12 are formed by compression molding in the second embodiment. Thereby, injection of seal resin is unnecessary, and the distribution of fillers included in the seal becomes uniform. Since injection of seal resin is unnecessary, wires are prevented from flowing.

Moreover, when the first and second resin are simultaneously formed, the first and second sheet-like resins may be provided in the cavity so that two resin layers are more uniformly formed in the cavity than in the case of granular resin being provided.

Figure 9A:
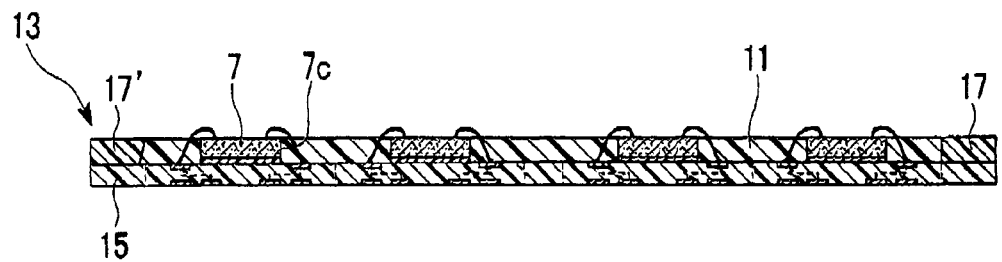
FIGS. 9A to 9C are cross-sectional views illustrating a sealing process included in the method of manufacturing the semiconductor device according to a third embodiment.
Figure 9B:
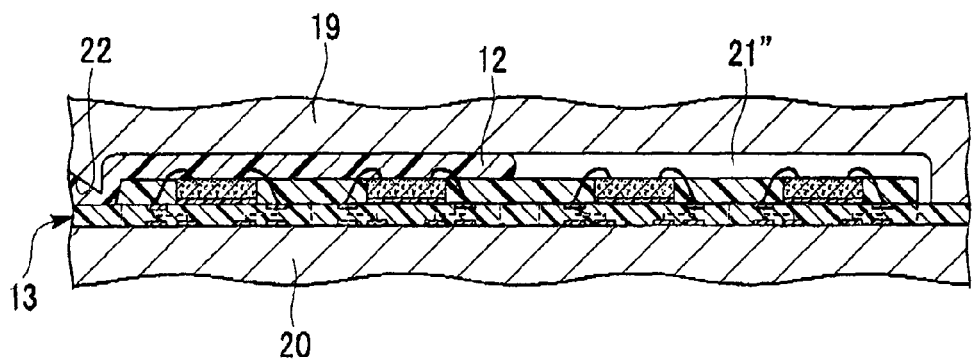
Figure 9C:
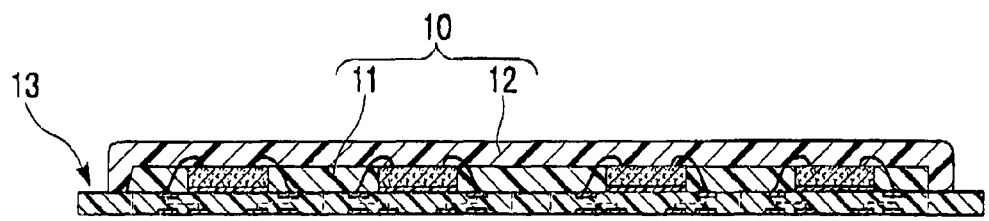

Third Embodiment:

FIGS. 9A to 9C are cross-sectional views illustrating a sealing process included in the method of manufacturing the semiconductor device according to a third embodiment. The third embodiment is a modification of the manufacturing method of the first embodiment.

In the third embodiment, a sealing frame 17' is provided on the frame 15 on the wiring motherboard 13. For example, the seal 17' has the same shape as that of the frame 15 and has the same thickness as that of the semiconductor chip 7 mounted on the wiring motherboard 13. An inner side surface of the frame 17' is inclined such that the area of the upper surface of the frame 17' is larger than that of the bottom surface of the frame 17' in contact with the wiring motherboard 13.

Similar to the first embodiment, the first resin 11 is filled around the semiconductor chip 7 by potting with use of a coating applicator or the like until the side surfaces of the semiconductor chip 7 is immersed in the first resin 11. In this case, the frame 17' blocks the seal resin.

Then, the first resin 11 is cured at a given temperature, for example, 180° C. Then, the frame 17' is removed from the wiring motherboard 13, thus the wiring motherboard 13 with the first resin 11 formed around the semiconductor chip 7 is obtained.

Since the inner side surface of the frame 17' is inclined in the third embodiment, the frame 17' can easily be removed from the wiring motherboard 13.

Then, the wiring motherboard 13 is attached to the transfer mold apparatus including the upper and lower molds 19, 20 such that a cavity 21" is formed, as shown in FIG. 9B. In this case, since a side surface of the first resin 11 on the wiring motherboard 13 is inclined, the inclined side faces the gate 22 of the transfer mold apparatus.

Then, the second resin 12 is provided into the cavity 22" formed by the upper and lower molds 19, 20. Since the first resin 11 has the inclined side facing the gate 22, the second resin 12 can easily be provided over the first resin 11.

After the cavity 21" is filled with the second resin 12, the second resin 12 is cured at a given temperature, for example, 180° C., and the second resin 12 is formed over the first resin 11 and the semiconductor chip 7 as shown in FIG. 9C.

Then, the conductive solder balls 5 are mounted on the respective lands 4 to form bump electrodes which will be external terminals, similarly to the first embodiment. Then, the wiring motherboard 13 on which the solder balls 5 are mounted is diced along the dicing line 16 into pieces of the element formation units 14, and the semiconductor device 1 as shown in FIG. 1 is obtained.

Thus, the semiconductor device 1 whose warpage is reduced can be formed similarly to the first embodiment.

Figure 10:
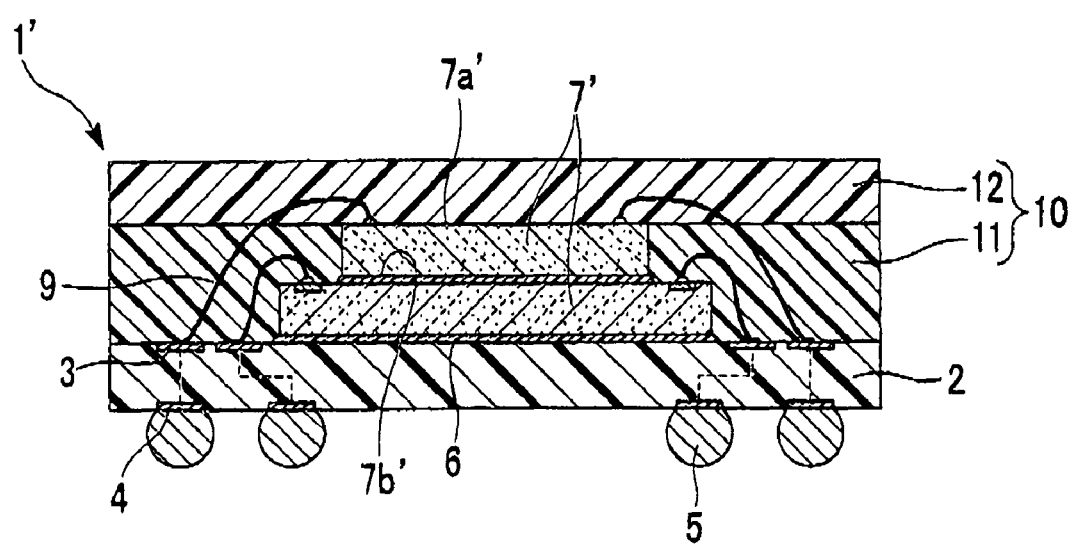
FIG. 10 is a cross-sectional view illustrating a semiconductor device according to a fourth embodiment of the present invention.

Fourth Embodiment:

FIG. 10 is a cross-sectional view illustrating a semiconductor device 1' according to a fourth embodiment of the present invention. The fourth embodiment explains the case where the present invention is applied to MCP (Multi Chip Package) including multiple semiconductor chips 7' mounted.

As shown in FIG. 10, in the semiconductor device 1' including the semiconductor chips 7' on the wiring substrate 2, the first resin 11 is filled up to an upper surface 7a' of the uppermost semiconductor chip. Then, the second resin 12 is formed over the first resin 11 and the uppermost semiconductor chip.

Consequently, a balance of thermal expansion coefficients in the MCP is enhanced regardless of a state of the stacked semiconductor chips 7'.

In the case of three or more semiconductor chips being stacked, the first resin 11 is filled up to the upper surface 7a' of the uppermost semiconductor chip in a similar manner.

In the case of the uppermost semiconductor chip being used for flip chip connection, the first resin is filled up to a bottom surface 7b' of the uppermost semiconductor chip.

It is apparent that the present invention is not limited to the above embodiments, but may be modified and changed without departing from the scope and spirit of the invention.

For example, although the wiring substrate made of a glass epoxy material is used in the embodiments, the present invention is applicable to a wiring substrate made of another material, such as a flexible substrate made of a polyamide material.

In the case of a flexible wiring substrate made of a polyamide material being used, a thermal expansion coefficient of the second resin is set to approximately $20 \times 10^{-6}$ to $25 \times 10^{-6}/°$ C. corresponding to that of polyamide resin.

Additionally, although the BGA-type semiconductor device is explained in the embodiments, the present invention is applicable to another semiconductor device, such as an LGA (Land Grid Array)-type semiconductor device.

The present invention is widely applicable to semiconductor manufacturing industries.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to a device equipped with the present invention.

What is claimed is:

1. A semiconductor device, comprising:
    a substrate that includes at least a first region and a second region;
    a semiconductor chip structure that is mounted over the first region;
    a first insulator that covers the second region, the first insulator having a first thermal expansion coefficient approximately equal to that of the semiconductor chip structure; and
    a second insulator that covers the semiconductor chip structure and the first insulator so that the semiconductor chip structure and the first insulator are sandwiched between the substrate and the second insulator, the second insulator having a second thermal expansion coefficient approximately equal to that of the substrate.

2. The semiconductor device according to claim 1, wherein the first and second insulators form a seal.

3. The semiconductor device according to claim 1, wherein the first insulator is made of epoxy resin including a greater amount of glass fiber than that included in the second insulator.

4. The semiconductor device according to claim 1, wherein the first thermal expansion coefficient ranges from $2 \times 10^{-6}$ to $4 \times 10^{-6}/°$ C., and
    the second thermal expansion coefficient ranges from $12 \times 10^{-6}$ to $14 \times 10^{-6}/°$ C.

5. The semiconductor device according to claim 1, wherein the semiconductor chip structure is a single semiconductor chip.

6. The semiconductor device according to claim 5, wherein the first insulator has a thickness identical to that of the single semiconductor chip.

7. The semiconductor device according to claim 1, wherein the semiconductor chip structure is a stack of semiconductor chips.

8. The semiconductor device according to claim 7, wherein the first insulator has a thickness identical to that of the stack of semiconductor chips.

9. A semiconductor device comprising:
    a substrate;
    a semiconductor chip having an upper surface, a lower surface opposed to the upper surface, and side surfaces joined to the upper surface and the lower surface, and the semiconductor chip being mounted over the substrate so that the lower surface faces the substrate;

a first sealing resin that covers the side surfaces of the semiconductor chip; and a second sealing resin that covers the upper surface of the semiconductor chip to sandwich the semiconductor chip between the substrate and the second sealing resin, wherein a thermal expansion coefficient of the second sealing resin is larger than that of the first sealing resin.

10. The semiconductor device according to claim 9, wherein a thickness of the first sealing resin is approximately equal to a thickness of the semiconductor chip.

11. The semiconductor device according to claim 9, wherein a thickness of the second sealing resin is approximately equal to a thickness of the substrate.

12. The semiconductor device according to claim 9, wherein the thermal expansion coefficient of the first sealing resin is approximately equal to that of the semiconductor chip.

13. The semiconductor device according to claim 9, wherein the thermal expansion coefficient of the second sealing resin is approximately equal to that of the substrate.

14. The semiconductor device according to claim 9, further comprising:

an additional semiconductor chip that is provided between the substrate and the semiconductor chip.

15. The semiconductor device according to claim 9, wherein a border between the first sealing resin and the second sealing resin is substantially flat without having a difference in level.

16. A semiconductor device, comprising:

a substrate having a first surface;

a first semiconductor chip that is mounted over the first surface of the substrate;

a first sealing resin that is provided on the first surface of the substrate; and a second sealing resin that is provided on the first sealing resin, the second sealing resing including a filler, wherein a filler content of the second sealing resin is smaller than that of the first sealing resin, and a border between the first sealing resin and the second sealing resin is substantially flat without having a difference in level.

17. A semiconductor device comprising:

a substrate having a first surface;

a first semiconductor chip that is mounted over the first surface of the substrate;

a first sealing resin that is provided on the first surface of the substrate; and a second sealing resin that is provided on the first sealing resin wherein a filler content of the second sealing resin is smaller than that of the first sealing resin, and a thermal expansion coefficient of the second sealing resin is approximately equal to that of the substrate.

18. The semiconductor device according to claim 17, wherein a thickness of the first sealing resin is approximately equal to a thickness of the first semiconductor chip.

19. The semiconductor device according to claim 17, wherein a thickness of the second sealing resin is approximately equal to a thickness of the substrate.

20. The semiconductor device according to claim 17, wherein a thermal expansion coefficient of the first sealing resin is approximately equal to that of the first semiconductor chip.

21. The semiconductor device according to claim 17, wherein a thermal expansion coefficient of the second sealing resin is approximately equal to that of the substrate.

22. The semiconductor device according to claim 17, further comprising a second semiconductor chip disposed between the substrate and the first semiconductor chip.

23. The semiconductor device according to claim 17, wherein the second sealing resin includes a filler.

* * * * *